United States Patent [19]
Cooper

[11] 3,997,915
[45] Dec. 14, 1976

[54] FREQUENCY MODULATING AND DEMODULATING METHOD AND APPARATUS

[75] Inventor: Eugene A. Cooper, Placentia, Calif.

[73] Assignee: BASF Aktiengesellschaft, Ludwigshafen (Rhine), Germany

[22] Filed: Apr. 24, 1975

[21] Appl. No.: 571,379

[52] U.S. Cl. .................................. 360/30; 332/19
[51] Int. Cl.² .......................................... G11B 5/04
[58] Field of Search ..................... 360/30; 332/19

[56] References Cited
UNITED STATES PATENTS

| | | | |
|---|---|---|---|
| 2,583,983 | 1/1952 | Arndt | 360/30 |
| 3,414,842 | 12/1968 | Broadhead, Jr. | 332/19 |
| 3,423,540 | 1/1969 | Wortzman | 360/30 |
| 3,622,913 | 11/1971 | Shipley | 332/19 |
| 3,637,951 | 1/1972 | Brown, Jr. | 360/30 |

*Primary Examiner*—Jay P. Lucas
*Attorney, Agent, or Firm*—Johnston, Keil, Thompson & Shurtleff

[57] ABSTRACT

An apparatus and method for the frequency modulation and demodulation of a carrier signal by a modulating frequency signal, whereby essentially the same apparatus is used for both functions. During demodulation, the modulating device is switched into a closed loop having a relatively narrow bandwidth, thereby permitting the carrier generated by the modulator to be locked in phase with the signal to be demodulated. During modulation, the loop is opened up and the modulator is used in a normal fashion.

7 Claims, 3 Drawing Figures

FREQUENCY MODULATING AND DEMODULATING METHOD AND APPARATUS

BACKGROUND OF THE INVENTION

1. Field of the Invention

In a conventional television system, the sound signal accompanying the picture comprises a frequency modulated (FM) signal transmitted on a separate carrier. The video signals themselves can also be transmitted or recorded as frequency modulated signals. The use of frequency modulation is due to a number of advantages which FM enjoys over the more conventional amplitude modulated (AM) signal employed in broadcast-band radio for instance, such as greater freedom from interference and noise. There is more than adequate bandwidth in a 6-Mc television channel for the FM sound and video signals.

2. Description of the Prior Art

Voltage controlled oscillators are well known in the art for the purpose of frequency modulating a carrier in response to an audio signal. Likewise, demodulation loops are known which will lock the phase of a carrier signal generator to that of the received FM signal so that the frequency difference between the signals, and thus the transmitted audio signal, can be obtained. In the prior art, the modulation and demodulation functions are performed by separate devices. That is, the modulator is located at the transmitting station and the demodulator at the receiving station of a television signal. Since it is necessary for a self-contained video recorder to perform both of these functions, it would be advantageous to have a single device which can be made to operate in either a modulate or a demodulate mode.

SUMMARY OF THE INVENTION

It is accordingly an object of the present invention to provide a device which can be made to frequency modulate or demodulate an audio signal by means of the same circuitry or to frequency modulate or demodulate a video signal by another single circuitry.

It is a further object of the invention to provide a device for modulation and demodulation which can be manufactured easily and at low cost and which is lightweight, compact and reliable.

It is yet a further object of the present invention to provide a phase-locked demodulator loop which can also be used to perform the function of a modulator.

It is another important object to eliminate audio signal distortions arising from irregularities in the movement of the information storing medium in a recorder/playback unit.

BRIEF DESCRIPTION OF THE DRAWING

The foregoing and other objects, features and advantages of the invention will be apparent from the following description of the drawings in which.

DESCRIPTION OF THE PREFERRED EMBODIMENTS

Figure 1:
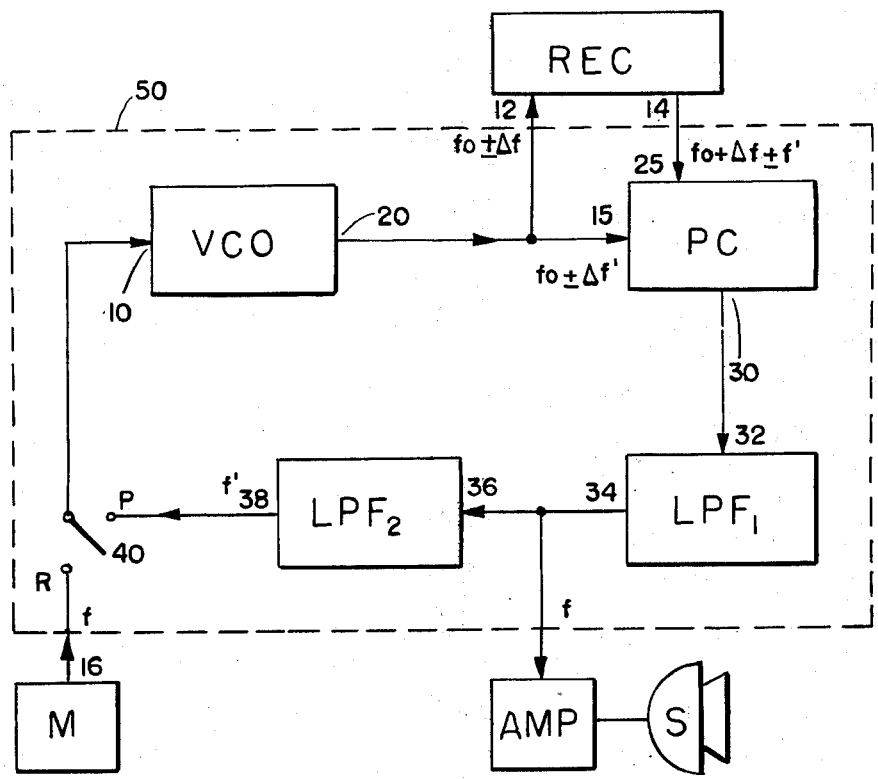
FIG. 1 is a schematic block diagram of a complete modulating and demodulating system according to the present invention.

Referring now to FIG. 1, there is shown a block diagram of a phase-locked loop circuit 50 for frequency modulation and demodulation of a modulating frequency signal $f$.

The overall circuit shows a source M of modulating frequency signals, e.g. of audio frequency, a switch 40 having two possible positions, R and P, and a voltage controlled oscillator VCO which produces an output signal at 20 comprising a carrier signal $f_o$ that has been frequency modulated in dependence on the signal at input 10. The circuit further includes a recording device REC of any conventional type having an input 12 and an output 14, a phase comparator PC with inputs 15, 25 and an output 30, two low pass filters, $LPF_1$ and $LPF_2$ with inputs 32, 36 and outputs 34, 38, respectively, and an output device consisting in this example of an audio amplifier AMP and speaker S. All of the circuit components shown in FIG. 1 are of a type well known in the art. Input 12 of the recording device REC may be deactivated during playback, and output 14 during recording, by other switches (not shown) in the well-known manner.

Referring now to the operation of the invention, it can be seen that when switch 40 is in position R, a continuous circuit is formed from audio source M (output 16) through oscillator VCO to input terminal 12 of the recording device REC and that the "loop" comprising components VCO, PC, $LPF_1$ and $LPF_2$ is "open." When an audio frequency signal $f$ from source M appears at input terminal 10 of VCO, the carrier frequency $f_o$ of VCO is modulated by signal $f$. The resulting FM signal $f_o \pm \Delta f$ then appears at output 20 of VCO, is received by REC at input 12 and is recorded on a recording medium such as a suitable recording disk or magnetic tape (not shown) for later playback.

In the embodiment of the invention shown in FIG. 1, audio frequency signal $f$ varies from 30 $H_z$ to 20 $KH_z$, for example. The carrier signal $f_o$ is 100 $KH_z$ and varies in frequency from $f_o - \Delta f$, 90 $KH_z$ to $f_o + \Delta f$, 110 $KH_z$ in dependence upon the voltage appearing at input 10 of VCO. Here, the modulation deviation $\Delta f$ is chosen at $\pm$ 10 $KH_z$, for example. Of course, in this embodiment the recording device must be capable of accurately recording signals up to 110 $KH_z$.

When switch 40 is moved to position P the playback circuit is formed. The circuit consists of a "closed" loop comprising the elements VCO, PC, $LPF_1$ and $LPF_2$; the previously recorded frequency modulated signal is supplied to input 25 of the phase comparator PC by recording device REC, viz. in the form $f_o \pm \Delta f \pm f'$, wherein $f'$ is a frequency error exhibited by the playback signal.

Phase comparator PC is of conventional type and provides an output signal at terminal 30 which is a signal proportional to a difference in frequency between the signals appearing at its inputs 15 and 25. The output signal from PC is then filtered through a first low pass filter $LPF_1$ which has a predetermined cutoff frequency suitable for trapping the carrier signal $f_o$ and for passing signals in the audio frequency range, such as $f$. The frequency $f_o$ must be sufficiently greater than the upper audio frequency range to permit this filtering. The output signal of $LPF_1$ is filtered through a second low pass filter $LPF_2$, which has a predetermined cutoff frequency near the lower end of the audio frequency spectrum. This second cutoff frequency is determinative of the bandwidth of the phase-locked loop.

The low frequency "error" signal $f'$ appearing at output 38 of $LPF_2$ is fed back to input 10 of voltage controlled oscillator VCO. Oscillator VCO in turn modulates carrier $f_o$ by the signal $f'$ and supplies a frequency modulated signal $f_o \pm \Delta f'$ to input 15 of phase comparator PC. The audio output system comprising an amplifier AMP having an input 18 and speaker S picks up the audio frequency signal $f$ from output 34 of $LPF_1$, amplifies the signal, and provides an audible reproduction of signal $f$ of excellent quality.

In operation, the loop locks up to frequency $f_o$. Because of the feedback error signal $f'$ modulating carrier $f_o$ of VCO the loop will tend to track any relative phase shifts between the carrier signal $f_o$ supplied by oscillator VCO and the carrrier signal $f_o$ supplied by recording device REC. Phase locking the carrier signals has the advantage of correcting for minor tape travel distortions for example, variations in record and playback speed, and tape flutter which are responsible for wow and the like, and for minor deviations in the oscillator frequency.

In the preferred embodiment of the invention where $f_o$ is chosen to be 100 $KH_z$, the cutoff frequencies of $LPF_1$ and $LPF_2$ are approximately 50 $KH_z$ and 30 $H_z$, respectively. The loop bandwidth is equal to the cutoff frequency of $LPF_2$, or 30 $H_z$. For a constant $f$ greater than 30 $H_z$, during playback the frequency modulated signal at output 14 of REC will vary around the midpoint frequency of 100 $KH_z$, in case of maximum amplitude signal, from 90 $KH_z$ to 110 $KH_z$, and the output of VCO will be 100 $KH_z$. If for example the frequency of $f$ is 1$KH_z$, the output 30 of PC will be proportional to the frequency difference between the signals appearing at its inputs 15 and 25, in this case 1$KH_z$. The 1$KH_z$ output of PC will pass through $LPF_1$, to audio output amplifier AMP, but will be blocked by $LPF_2$ and therefore will not affect VCO.

On the other hand, if the frequency variation at output 14 of REC is equivalent to only 10 $H_z$, for instance, output 30 of PC is 10 $H_z$. The 10 $H_z$ signal or, for that matter, all signals having a frequency up to 30 $H_z$ will pass through both filters to VCO. Thus, if the loop gain is sufficiently high, the system will practically immediately follow variations in input from REC up to 30 $H_z$, thereby locking the phase of the VCO output to the phase of the REC output and preventing any modulation noise up to 30 $H_z$.

Figure 2:
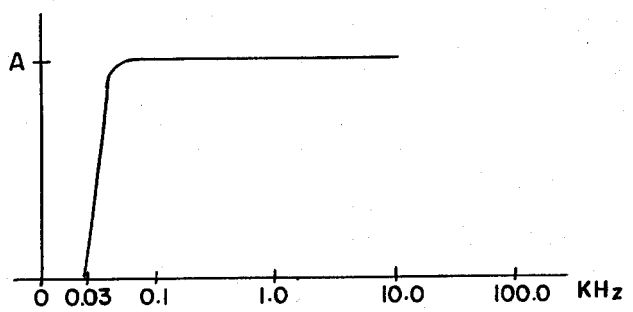
FIG. 2 illustrates the audio frequency response characteristic of the system in FIG. 1.

FIG. 2 illustrates on a logarithmic scale the audio output response of the phase-locked loop to a zero to 10 $KH_z$ sweep signal of amplitude A. The signal is first recorded according to the procedures described above, with switch 40 in position R, and then played back with the switch in position P. The loop tracks variations up to 30 $H_z$ (0.03 $KH_z$) and passes to the audio amplifier those sweep frequencies above 30 $H_z$.

Figure 3:
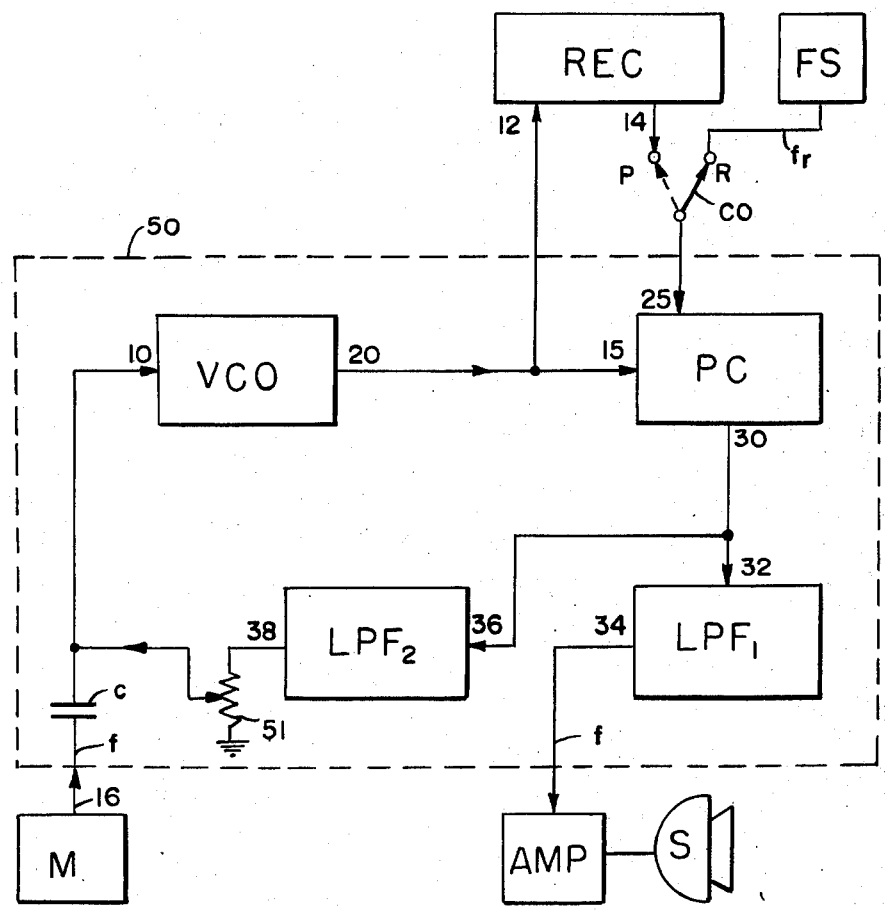
FIG. 3 shows a schematic block diagram of a modification of the modulating/demodulating system of FIG. 1.

A modification of the embodiment of the invention shown in FIG. 1 is illustrated in FIG. 3 wherein like parts are designated by like reference characters. In this modified circuit arrangement a frequency source FS supplying a reference frequency $f_r$ is used and a transfer switch CO switchable between this source FS in recording and the output terminal 14 of recorder REC in playback, is connected to input 25 of phase comparator PC. Frequency source FS may be, for example, a crystal controlled and hence a very stable local source of carrier frequency. Thus, with switch CO in record position R as shown in FIG. 3, voltage controlled oscillator VCO which is free-running in the case of FIG. 1, is phase locked to reference source FS in the modified circuit of FIG. 3. With switch CO in playback position P the connection between the phase comparator and frequency source FS is broken and input 25 of the phase comparator is connected to output 14 of the recorder instead.

In this embodiment the circuit has a permanently closed loop containing stages VCO, PC and $LPF_2$ during both recording and playback and the low pass filter $LPF_1$, rather than being interposed in the loop is series with $LPF_2$ as in FIG. 1, is provided outside the loop and thus is used in the demodulation mode, that is, at playback only.

In the circuit FIG. 3 the modulating signal is fed into the loop over a capacitor C and potentiometer 51 is used to regulate the loop gain.

In FIG. 3 the utilization in the recording mode of the already available phase-locked loop in conjunction with reference frequency source FS, FIG. 3, has the advantage that in this way the frequency of the carrier $f_o$ can be stabilized very accurately without the employment for this purpose of an expensive voltage controlled oscillator with highly precise components.

In a preferred embodiment of the invention, all components of the phase-locked loop circuit are manufactured in a single integrated circuit chip which can be produced at low cost and which is compact, lightweight and reliable in operation. It can be seen from the foregoing description of the invention that a single circuit may be used to perform both modulating and demodulating functions.

It will be understood that numerous modifications and variations may be made in the system according to this invention and that applicant does not intend to be limited to a specific form thereof except in accordance with the appended claims. For example, while the embodiments disclosed herein show the invention as applied to the recording of sound signals in frequency modulated form, it is equally possible to use the principles of the invention in connection with the recording of video signals by means of frequency modulation. It goes without saying that, if the modulating signal is a video signal, for example one with an upper frequency of around 3MHz, the carrier frequency must be chosen high enough—3.5 MHz or higher—to permit modulation by such a video signal, and the various system components must be designed accordingly.

I claim:
1. A modulating and demodulating apparatus comprising:
   a. a signal source of modulating frequency,
   b. a voltage controlled oscillator having an input and an output and means for providing at said output a carrier signal of a frequency higher than said modulating frequency signal and which is frequency modulated in dependence upon said modulating frequency signal when impressed on said oscillator input,
   c. recording means operatively connected for recording the signal appearing at said oscillator output and for playing back said recorded signal at a playback output,
   d. phase comparator means operatively connected for comparing the phase of the signal appearing at said oscillator output with the phase of the signal appearing at said playback output and providing an output signal proportional to the difference in frequency between said compared signals at the output of said phase comparator,
e. low pass filter means for receiving said phase comparator output signal, blocking the frequency components of said phase comparator output signal which are greater than a first predetermined frequency and permitting the remainder of the frequency components of said phase comparator output signal to pass,
f. other low pass filter means for receiving the passed output signal of said first low pass filter, blocking the frequency components of said first low pass filter output signal which are greater than a second predetermined frequency, said second predetermined frequency being less than said first, and permitting the remainder of the frequency components of said first low pass filter output signal to pass to an output,
g. output means for receiving said first low pass filter output signal and providing a demodulated output signal porportional thereto, and
h. switch means (1) for operatively connecting said modulating frequency signal source to said oscillator input when the apparatus is to be used for recording said modulating frequency signal, in frequency modulated form, (2) and for operatively connecting said second low pass filter output to said oscillator input when the apparatus is to be used for playing back said modulating frequency signal in the unmodulated form of said demodulated output signal thereby forming a phase-locked signal loop from said oscillator through said phase comparator means, through said first and second low pass filter means, through said switch means and back to said oscillator.

2. The apparatus of claim 1, wherein said first predetermined frequency is greater than 30 KH$_z$.

3. The apparatus of claim 1, wherein said second predetermined frequency is less than 50 H$_z$.

4. A modulating and demodulating method comprising the steps of:
a. frequency modulating a carrier signal by a modulating frequency signal with a voltage controlled oscillator;
b. recording said frequency modulated carrier signal;
c. disconnecting the source of said modulating frequency signal from said oscillator;
d. playing back said recorded, frequency modulated carrier signal;
e. comparing in a phase comparator the phase of said recorded, frequency modulated signal with the phase of the signal output of said oscillator, and producing a comparator output signal proportional to the difference in frequency between said compared signals;
f. filtering out the frequency components of said comparator output signal which are greater than a first predetermined frequency in a first low pass filter and producing a demodulated signal output proportional to said filtered comparator output signal,
g. filtering out the frequency components of said comparator output signal which are greater than a second predetermined frequency, said second predetermined frequency being less than said first; and
h. frequency modulating said carrier signal by the frequency components of said comparator output signal which remain after the filtering step of (g), thereby providing a phase-locked signal loop during the playback of said recorded signal.

5. The method of claim 4, wherein said first predetermined frequency is greater than 30 KH$_z$.

6. The method of claim 4, wherein said second predetermined frequency is greater than 50 H$_z$.

7. In a recording and playback system, a modulating and demodulating arrangement wherein a carrier signal is frequency modulated by a modulating signal from a modulating signal source for recording thereon the frequency modulated signal on a recording apparatus, and wherein the frequency modulated signal received from said apparatus in playback is demodulated for reproducing the demodulated signal on reproduction means, said arrangement comprising:
a phase-locked loop of narrow bandwidth including, at least in playback, a voltage controlled oscillator providing at its output a carrier signal, a phase comparator two inputs of which are connected to the output of said oscillator and the output of said recording apparatus, respectively, a filter means having a cutoff frequency near the lower end of the frequency range of the modulating signal and connected on its input side to the output of said phase comparator and on its output side to the input of said voltage controlled oscillator;
other filter means having a cut-off frequency above said frequency range and below said carrier frequency and being in circuit connection on their input side with the output of said phase comparator and on their output side at least with said reproduction means; and
circuit connections, at least in recording, between the input of said voltage controlled oscillator and said modulating signal source, and between the output of said voltage controlled oscillator and the input of said recording apparatus, such that said voltage controlled oscillator is used in both recording and playback.

* * * * *